United States Patent
Su et al.

(10) Patent No.: US 10,241,146 B2
(45) Date of Patent: Mar. 26, 2019

(54) TEST SYSTEM AND METHOD

(71) Applicant: Advantest Corporation, Tokyo (JP)

(72) Inventors: Mei-Mei Su, Mountain View, CA (US);
Ben Rogel-Favila, San Jose, CA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 15/583,729

(22) Filed: May 1, 2017

(65) Prior Publication Data
US 2018/0313889 A1 Nov. 1, 2018

(51) Int. Cl.
*G01R 31/28* (2006.01)

(52) U.S. Cl.
CPC ..... *G01R 31/2803* (2013.01); *G01R 31/2806* (2013.01); *G01R 31/2818* (2013.01)

(58) Field of Classification Search
CPC ............ G01R 31/2818; G01R 31/2806; G01R 31/3187
See application file for complete search history.

(56) References Cited

U.S. PATENT DOCUMENTS

| | | |
|---|---|---|
| 3,676,777 A | 7/1972 | Charters |
| 5,510,993 A | 4/1996 | Williams et al. |
| 6,008,636 A | 12/1999 | Miller et al. |
| 6,067,866 A | 5/2000 | Krajec et al. |
| 6,794,887 B1 | 9/2004 | Nelson et al. |
| 6,974,335 B1 | 12/2005 | Podpora |
| 7,046,027 B2 | 5/2006 | Conner |
| 7,084,659 B2 | 8/2006 | Delucco et al. |
| 7,315,972 B1 * | 1/2008 | Bapat ............ G01R 31/318516 714/736 |
| 7,443,184 B2 | 10/2008 | Norris |
| 7,532,023 B2 | 5/2009 | Norris |
| 7,649,374 B2 | 1/2010 | Fishman et al. |
| 7,810,006 B2 | 10/2010 | Yao et al. |
| 7,848,106 B2 | 12/2010 | Merrow |
| 7,852,094 B2 | 12/2010 | Chraft et al. |
| 8,078,424 B2 | 12/2011 | Adachi |
| 8,102,173 B2 | 1/2012 | Merrow |
| 8,117,480 B2 | 2/2012 | Merrow |
| 8,217,674 B2 | 7/2012 | Amaro et al. |
| 8,350,191 B2 | 1/2013 | Ondricek |
| 8,836,363 B2 | 9/2014 | Goel et al. |

(Continued)

*Primary Examiner* — Jermele M Hollington
*Assistant Examiner* — Alvaro Fortich (57) ABSTRACT

Presented embodiments facilitate efficient and effective access to a device under test. In one embodiment, a test system comprises: a device interface board (DIB) configured to interface with a device under test (DUT); and a primitive configured to control the device interface board and testing of the device under test. The primitive is an independent self contained test control unit comprising: a backplane interface configured to couple with the device interface board; a power supply component configured to control power to the backplane interface; and a site module configured to control testing signals sent to the device interface board and device under test. The site module is reconfigurable for different test protocols. The primitive can be compatible with a distributed testing infrastructure. In one exemplary implementation, the primitive and device interface board are portable an operable to perform independent testing unfettered by other control components.

20 Claims, 8 Drawing Sheets

(56) References Cited

U.S. PATENT DOCUMENTS

| | | |
|---|---|---|
| 2001/0038295 A1 | 11/2001 | Kim et al. |
| 2003/0117162 A1 | 6/2003 | Watts |
| 2003/0163298 A1* | 8/2003 | Odom .................. G06F 9/4411 |
| | | 703/21 |
| 2004/0246013 A1 | 12/2004 | Dejima |
| 2005/0200376 A1 | 9/2005 | Yee et al. |
| 2007/0040569 A1 | 2/2007 | Gopal et al. |
| 2009/0262455 A1 | 10/2009 | Merrow |
| 2009/0265032 A1 | 10/2009 | Toscano et al. |
| 2011/0012632 A1 | 1/2011 | Merrow et al. |
| 2011/0078525 A1 | 3/2011 | Xia et al. |
| 2012/0197582 A1 | 8/2012 | Richardson |
| 2014/0015559 A1 | 1/2014 | Lee |
| 2014/0236524 A1 | 8/2014 | Frediani et al. |
| 2015/0355231 A1 | 12/2015 | Rogel-Favila et al. |
| 2016/0314239 A1* | 10/2016 | Rabinovitch ....... G06F 17/5081 |

* cited by examiner

710
Coupling a device interface board (DIB) to a test primitive, wherein the primitive is configured to control testing of a device under test (DUT) and the device interface board is configured to selectively couple with the device under test and the primitive.

720
Configuring a primitive for testing the device under test, including loading a configuration firmware bit file on the primitive.

730
Directing testing of the device under test based upon independent testing control by the primitive.

TEST SYSTEM AND METHOD

FIELD OF THE INVENTION

The present invention relates to the field of electronic testing systems.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. These electronic systems and devices are typically tested to ensure proper operation. While testing of the systems and devices has made some advances, traditional approaches are typically expensive and often have limitations with regards to throughput and convenience.

Figure 1:
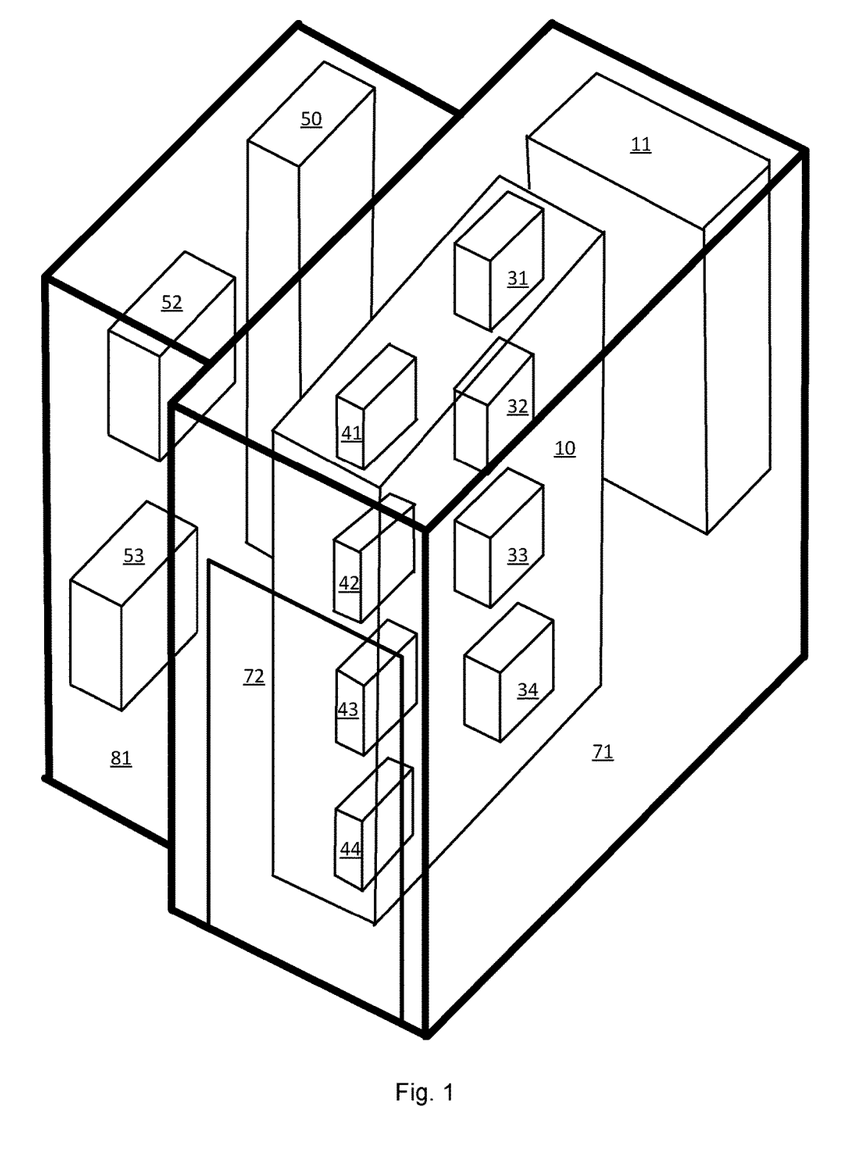
FIG. 1 is a block diagram of a conventional testing approach.

FIG. 1 is a block diagram of an exemplary conventional testing approach. It consists of a large controlled environmental chamber or oven 71 that contains an oven rack 10 and heating and cooling elements 11. The oven rack 10 contains devices under test (DUTs) in a number of loadboard trays 31, 32, 33, 34, 41, 42, 43, and 44. The environmental test chamber 71 has solid walls and a solid door 72 that enclose the test rack 10. The heating and cooling elements 11 can have a wide temperature range (e.g., −10 to 120 degrees C.). The test head 81 contains various racked components, including system controller network switches 52, system power supply components 53 and tester slices 50 (the tester slice contains the tester electronics). The loadboard trays 30 are loaded with devices under test and connected to tester slices 50 (multiple loadboard trays can be coupled to a single tester slice).

Conventional systems are not typically well suited for convenient testing because: 1) they are large systems that are stationary; 2) expensive to build, maintain and operate; and 3) are usually single purpose with limited flexibility. The components of traditional systems are typically tightly coupled and highly dependent upon each other for proper testing (e.g., tight speed clock requirements, hard wired high power cables, various close synchronization requirements, etc.). The large size and numerous hard wired components typically prevents mobility of the system to convenient testing locations. It is usually difficult to make changes in conventional single or limited purpose test systems (e.g., to meet or stay up with: advances in DUT technology, new or amended test protocols, DUT market demands, etc.). Changes in systems that have tightly coupled components usually involve numerous extensive and costly impacts to the whole system, and even if the change is only to a portion, the entire conventional tester system (e.g., test head, oven, etc.) typically needs to be shut down.

Traditional test approaches do not typically allow flexible or continued testing of some DUTs while other changes in other DUTs or test protocols are made. Furthermore, testing issues that arise during testing in a small portion of the large overall system can cause adverse impacts and delays throughout the whole system. There is a long felt need for a convenient and flexible volume production electronic device testing approach.

SUMMARY

Presented embodiments facilitate efficient and effective access to a device under test. In one embodiment, a test system comprises: a device interface board (DIB) configured to interface with a device under test (DUT); and a primitive configured to control the device interface board and testing of the device under test. The primitive is an independent self contained test control unit comprising: a backplane interface configured to couple with the device interface board; a power supply component configured to control power to the backplane interface; and a site module configured to control testing signals sent to the device interface board and device under test. The site module is reconfigurable for different test protocols. The primitive can be compatible with a distributed testing infrastructure. In one exemplary implementation, the primitive and device interface board are portable an operable to perform independent testing unfettered by other control components. The site module can be configured to communicate information to an exterior test component via a standard communication protocol and standard modular removable communication connector. The power supply component is configured to receive power from a standard utility outlet via a modular removable power connector, convert the standard utility power into device under test power levels, and control delivery of power to the device under test.

In one exemplary implementation, the site module includes a field programmable gate array (FPGA) and the FPGA is reprogrammable for different test protocols by loading different configuration firmware bit files. The system can also include a remote control component configured to enable control of the primitive remotely and an environmental component controller configured to direct control of environmental components of the device interface board. The backplane interface can be configured to be compatible with a universal interface configuration.

In one embodiment, a testing method comprises: coupling an independent test primitive to a device interface board (DIB), configuring the independent test primitive to control testing of the device under test (DUT) that is coupled to the device interface board, and directing testing of the device under test based upon independent testing control by the primitive. The independent test primitive can be configured to control testing of a device under test (DUT) that is coupled to the device interface board. In one exemplary implementation, configuring the independent test primitive includes loading a configuration firmware bit file on the primitive while electronic test components remain in the independent test primitive from one configuration to another. The firmware configuration bit file can be loaded on an FPGA of a primitive. The configuring can be performed as part of operations to accommodate a change from a first type of device under test to another second type of device under test. The method can include coupling the independent test primitive to a main controller or another primitive wherein the independent test primitive maintains independent testing control of respective device interface boards and devices under test. The method can include moving the independent test primitive from a first location to a second location to perform testing operations independent of other primitives and other control components.

In one embodiment, a test system comprises: a plurality of device interface boards (DIBs) configured to interface with devices under test (DUTs); a plurality of independent primitives respectively coupled to the plurality of device interface boards, wherein the plurality of primitives is configured to control the respective plurality of device interface boards and testing of the respective devices under test, and a rack for mounting the plurality of independent primitives and plurality of device interface boards. At least one of the plurality of primitives is an independent self contained test control unit comprising: a backplane interface configured to couple with the device interface board; a power supply component configured to control power to the backplane interface; and a site module configured to control testing signals sent to the device interface board and device under test. The system can also include a control console that is coupled to the plurality of primitives. The operations of the plurality of primitives can remain independent while being coordinated by the control panel. In one exemplary implementation, the primitive is configured to accommodate multiple different device under test form factors and be compatible with a universal interface configuration of the primitive. The universal interface configuration of the primitive can be compatible with interfaces of different device interface boards.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Presented embodiments facilitate convenient and efficient testing of electronic devices. In one embodiment, a test system core comprises a primitive, which is a self-contained independent unit or test cell that includes electronic components operable to control testing of a device under test. In one exemplary implementation, a test platform can include a primitive and a device interface board (DIB) that couples to devices under test. The primitive and device interface board can form a portable test system with minimal or no other infrastructure components as compared to traditional test systems. In one exemplary implementation, the test system easily couples a local utility power supply via a standard modular connection or plug (e.g., 120 AC, etc.) and can also easily couple to other components via a standard communication protocols and modular connections (e.g., Ethernet, USB, etc.). A test system with an independent test primitive is portable and capable of operating autonomously, free of and unfettered by reliance or necessity of other control components. While a primitive is capable of operating independently in a portable distributed infrastructure manner, a primitive can also interact with a central controller or other primitives.

The primitives can be linked together by a main networked controller into a collective or nested larger system. In one exemplary implementation, primitives are loosely coupled as compared to traditional systems, but the core features of the system in the respective primitives can operate independently (e.g., testing operations are not limited by tight clock timing or synchronization requirements between primitives, etc.). The size of the large system can be easily changed simply by increasing or reducing the primitives included in the system. The primitive based testing infrastructure facilitates easy changes to a DUT product mix on the test floor by reallocating primitives accordingly. It also allows the primitives to be interchanged or re-arranged within systems and between systems. In one embodiment, all testing is independently controlled by primitives, even if the primitive can communicate and coordinate with a main controller or other primitives.

In one embodiment, a primitive can be used to control testing of multiple different devices under test. A primitive test platform can easily be reconfigured to control testing of different DUT socket count, protocols and formats while maintaining consistent core primitive components. Reconfiguration of a primitive can be performed with minimal hard wired changes or physical removal of electronic components, unlike conventional test systems that require significant infrastructure and component alteration. In one exemplary implementation, testing of different types of DUTs can be accommodated by changing the device interface boards and loading a corresponding firmware bit file in the primitive. A primitive can include universal primitive interfaces that couple to different device interface boards and respective loadboards. The device interface boards can conveniently accommodate different device under test form factors while the configuration or form factor of the universal primitive interface remains similar from one loadboard to another. The universal primitive interfaces can include modular connectors that allow easy coupling and decoupling of the device interface board to and from respective primitives.

Figure 2:
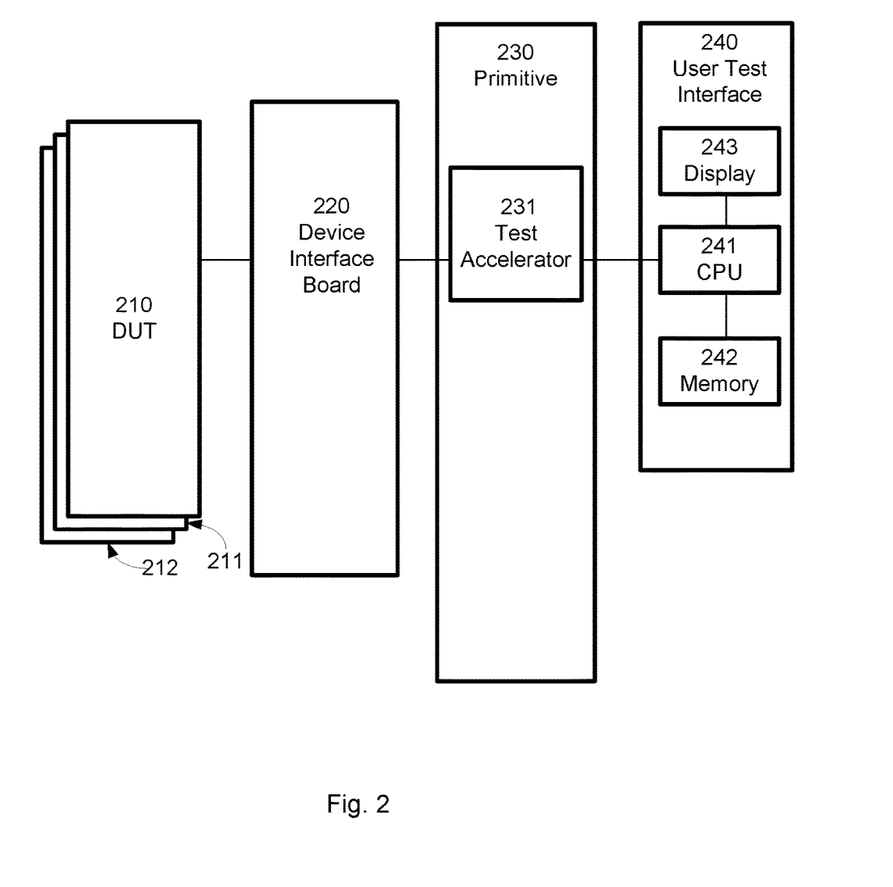
FIG. 2 is a block diagram of an exemplary test system in accordance with one embodiment.

FIG. 2 is a block diagram of an exemplary test environment or system 200 in accordance with one embodiment. The test environment or system 200 includes devices under test (e.g., 210, 211, 212, etc.), device interface board 220, primitive 230, and user test interface 240. The devices under test (e.g., 110, 111, 112, etc.) are coupled to the device interface board 220 which is coupled to primitive 230, which in turn is coupled to the user interface 240. User test interface 240 includes CPU 241, memory 242, and display 243. In one embodiment, the primitive 230 comprises an FPGA that includes a test accelerator 231. The FPGA is configured to perform preliminary analysis and reconfiguration of persistent test information. Device interface board 220 is configured to electrically and physically couple a device under test (e.g.m 210, 211, 212, etc.) to the primitive 230.

Figure 3:
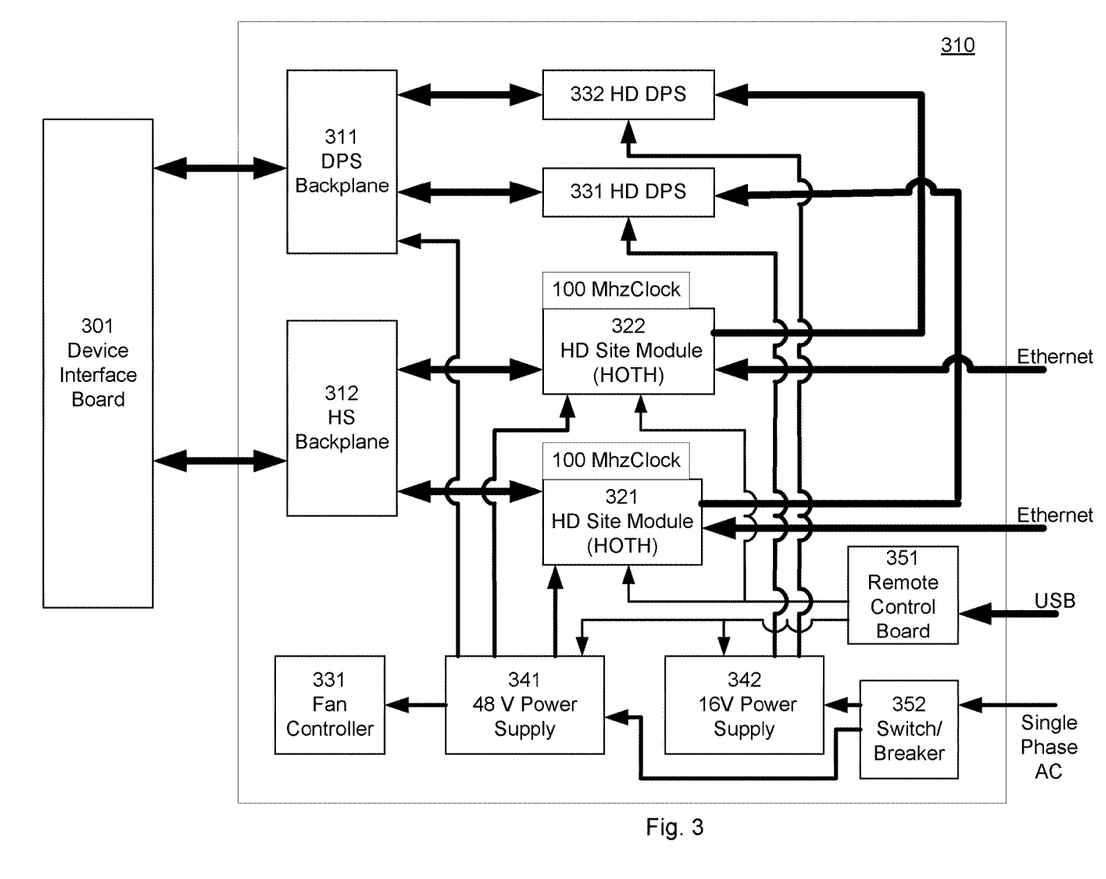
FIG. 3 is a block diagram of an exemplary test system primitive in accordance with one embodiment.

FIG. 3 is a block diagram of exemplary test system primitive 310 in accordance with one embodiment. Test system primitive 310 includes power supply backplane 311, direct current (DC) power supplies 331 and 332, signal backplane 312, site modules 321 and 322, alternating current/direct current (AC/DC) power conversion components 341 and 342, switch/breaker 352, remote control component 351 and environmental component controller 331. Power supply backplane 311 is coupled to AC/DC power conversion component 341 and DC power supplies 311 and 312 which in turn are coupled to AC/DC power conversion components 341 and 342. AC/DC power conversion components are coupled to switch/breaker 352 and remote control component 351. AC/DC power conversion component 341 is coupled to environmental component controller 331. Signal backplane 312 is coupled to site modules 321 and 322. Power supply backplane 311 and signal backplane 312 are coupled to DUT interface board 201.

The components of exemplary test system primitive 310 cooperatively operate to control testing of devices under test via device interface board 301. The switch/breaker 352 controls AC power flow. In one embodiment, the AC power flow is supplied via a standard plug or connection into a utility outlet or socket. The AC power is fed into AC/DC power conversion components 341 and 342 which convert or transform the AC power into 48 V DC power and 16 V DC power respectively. The 48 V DC power is supplied to power supply backplane 311 and site modules 321 and 322. The 16 V DC power is supplied to controller 331 and DC power supplies 331 and 332. DC power supplies 331 and 332 control supply of the 16 V DC power to power supply backplane 311. Site modules 321 and 322 receive Ethernet signals and generate control test signals that are conveyed to signal backplane 312. In one exemplary implementation, signal backplane 312 is a high speed signal backplane. Signal backplane 312 communicates test signals to device interface board 301 which communicates the test signals to DUTs (not shown). Power backplane 311 conveys power to device interface board 301 which conveys the power to DUTs (not shown). Remote control board 351 is a remote control component that is responsive to external remote USB signals. In one exemplary implementation, the remote control includes a remote on/off control function.

Figure 4:
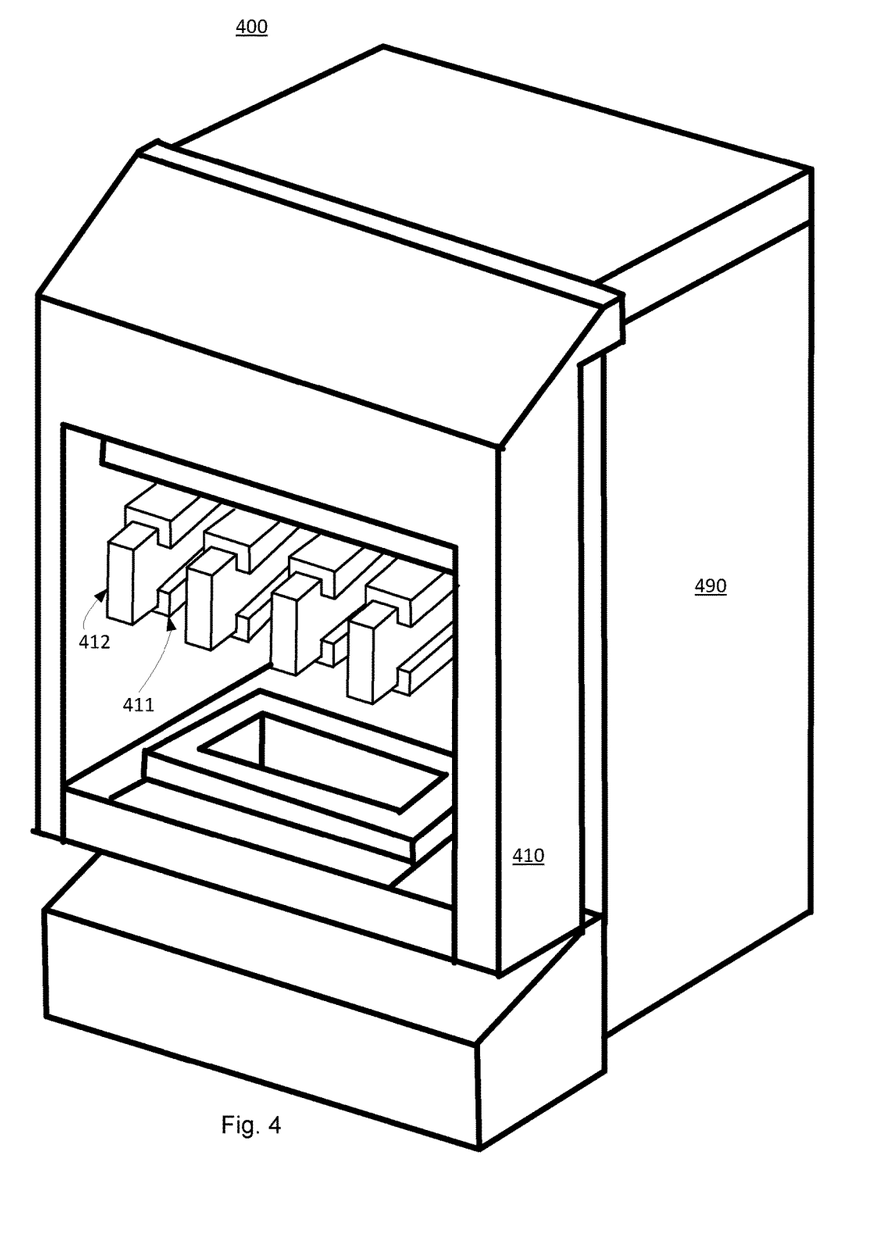
FIG. 4 is a block diagram of an exemplary test system in accordance with one embodiment.

FIG. 4 is a block diagram of an exemplary test system 400 in accordance with one embodiment. Test system 400 includes a testing primitive 490 (e.g., containing the testing control hardware and power supply components for the devices under test, etc.) and a device interface board 410 disposed in front of and coupled to the primitive 490. In one embodiment, the device interface board 410 is a partial enclosure and configured to couple with the devices under test 412 placed in coupling mechanism or component 411. In one exemplary implementation, the coupling mechanisms or components are sockets that enable the devices under test to be coupled to a loadboard included in the device interface board 410. The loadboard can be positioned towards the back of the device interface board. The loadboard is also coupled to the primitive 490 to obtain power and high speed electrical signals for testing the device under test 412.

Figure 5:
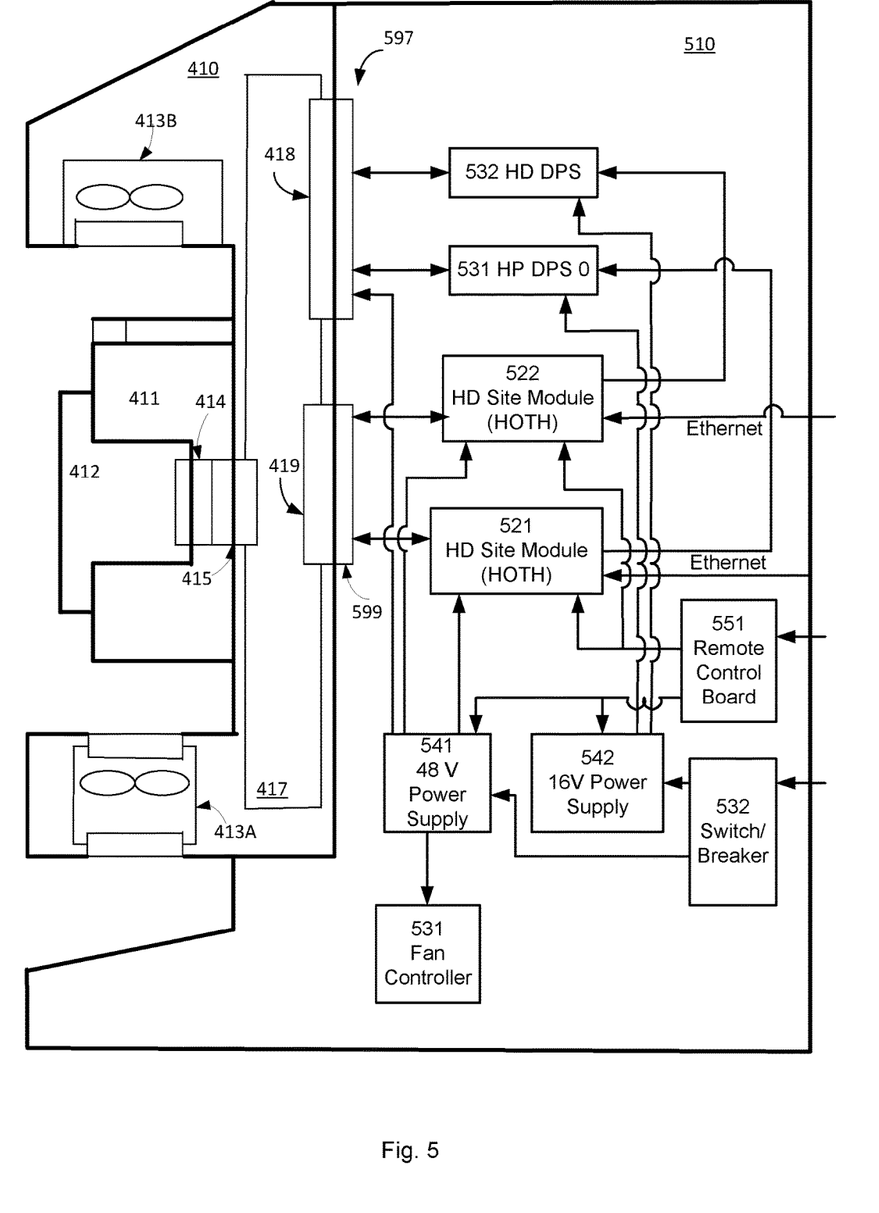
FIG. 5 is a cutaway of an exemplary test system accordance with one embodiment.

FIG. 5 is a cutaway of exemplary test system 500 in accordance with one embodiment. Primitive 510 is similar to primitive 490. Primitive 510 is coupled to device interface board 410. In addition to coupling components 411, the device interface board 410 also includes loadboard 417 and environmental components 413A and 313B. Environmental control components 413A and 413B control and maintain device under test ambient environmental conditions (e.g., temperature, air flow rate, etc.). Devices under test (e.g., 412, etc.) are placed in or coupled to coupling components (e.g., 411, etc) which match the form factor of the devices under test. Loadboard 417 includes a device under test interface 415 which electrically couples with the device under test 412 via interface 414 (interface 414 is part of the device under test 412). Loadboard 417 also includes interfaces 418 and 419 which electrically couple to the backplane interfaces 597 and 599 of primitive 510. In one exemplary implementation, interfaces 418 and 419, and backplane interfaces 597 and 599 are compatible with a universal interface configuration. The universal interface configuration allows loadboards that support different configurations of devices under test to be readily compatible with primitive interface form factors that remain constant.

In one embodiment, test system primitive 510 is similar to test system primitive 310. Test system primitive 510 includes power supply backplane 511, direct power supplies 531 and 532, signal backplane 512, site modules 521 and 522, AC/DC power conversion components 541 and 542, switch/breaker 552, remote control component 551 and environmental component controller 531. Power supply backplane 511 is coupled to AC/DC power conversion component 541 and HD DC power supplies 511 and 512 which in turn are coupled to AC/DC power conversion components 541 and 542. AC/DC power conversion components are coupled to switch/breaker 552 and remote control component 551. AC/DC power conversion component 541 is coupled to environmental component controller 531. Signal backplane 512 is coupled to site modules 521 and 522. Power supply backplane 511 and signal backplane 512 are coupled to DUT interface board 417.

In one embodiment, a test system device interface boards and primitive can enable convenient testing of devices having different device form factors with little or no changes to test system electronics, unlike traditional systems that are typically single purpose hardwired systems. The device interface boards can be modular and easily coupled to and decoupled from a primitive. While device interface board 410 is easily removable from the primitive 510, the electronic components of primitive 510 are not removed. In one embodiment, to test devices of a different form factor, a different device interface board can be swapped with device interface board 410 but test electronics of the primitive 510 can remain substantially unchanged. In this fashion, by swapping out the device interface board, different form factors of device under test can be easily accommodated. The electronic test components remain in the independent test primitive from one configuration to another. In one exemplary implementation, a firmware configuration bit file can be easily uploaded to the primitive 510 to accommodate different test approaches and protocols or formats compatible with a standard. In one exemplary implementation, devices under test are solid state drives (SSDs) and different form factors can be accommodated (e.g., such as, SATA 2.5", M.2, U.2, etc.). The primitive can be can be configured to be compatible with different bus standards (e.g., PCIe, SATA, etc.) and different interface formats (e.g., NVMe, NVMHCI, AHCI, etc.). Device interface boards can have different form factor interfaces on a device under test side and a universal form factor on a primitive side.

Figure 6:
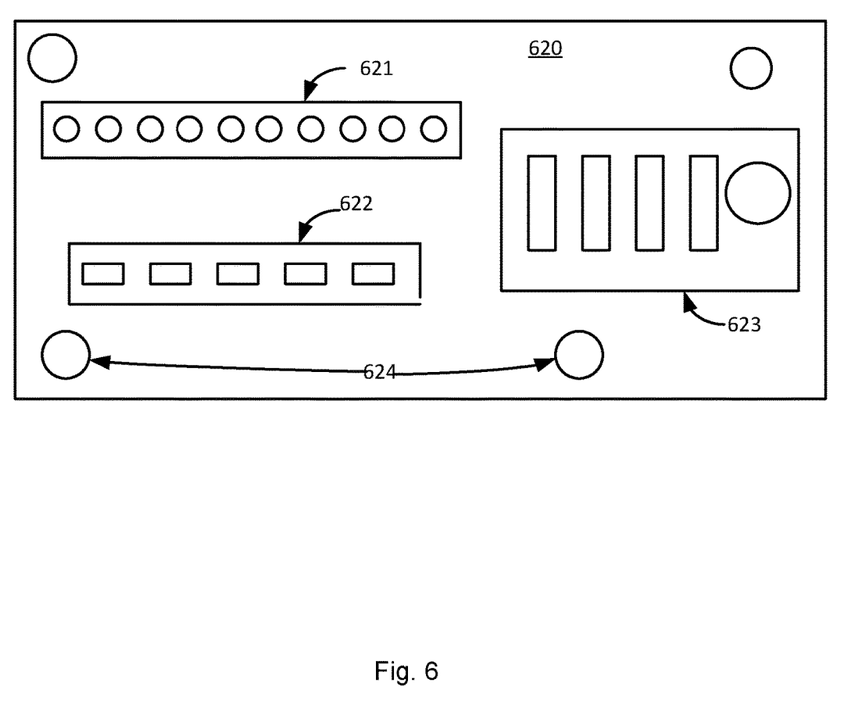
FIG. 6 is a block diagram of an exemplary primitive backplane configuration for coupling with a device interface board in accordance with one embodiment.

FIG. 6 is a block diagram of an exemplary primitive backplane configuration for coupling with a device interface board in accordance with one embodiment. A primitive and device interface board can include complimentary versions of a universal interface 620 for connecting to the backplane of the tester electronics in the primitive. In one embodiment, the universal interface mates or couples backplane connections of the primitive and the device interface board. The universal interface includes power connections 623 and high speed electrical connections 621 and 622 (e.g., pin electronics, high speed side band and diagnostic connections, etc). In one embodiment, alignment components (e.g., 624, etc.) help align the primitive and the device interface board.

Figure 7:
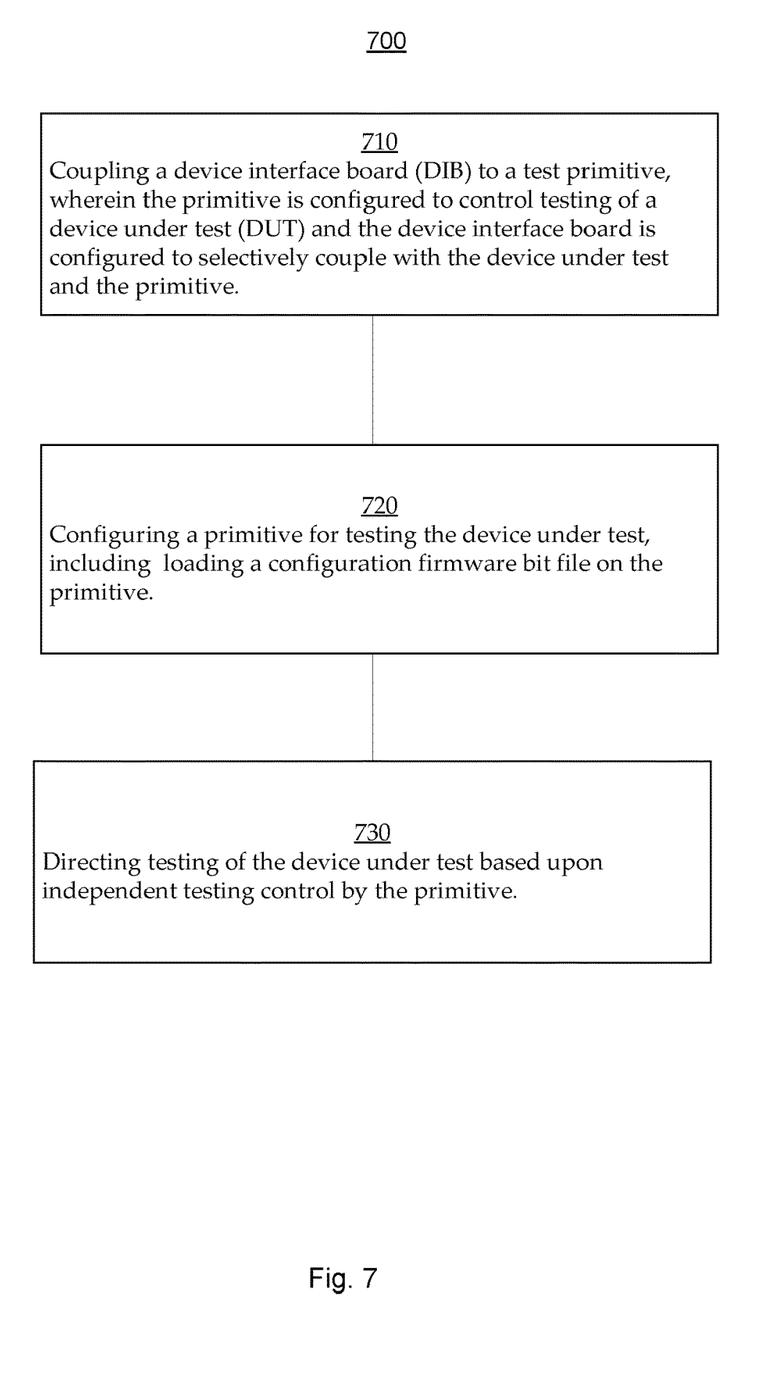
FIG. 7 is a flow chart of a testing method in accordance with one embodiment.

FIG. 7 is a flow chart of a testing method in accordance with one embodiment.

In block 710, an independent test primitive is coupled to a device interface board. The device interface board is configured to selectively couple with the device under test and the primitive. The independent test primitive is configured to control testing of a device under test. In one embodiment, coupling a device interface board to a test primitive is performed via interfaces configured in a universal configuration.

In block 720, the independent test primitive is configured to control testing of the device under test. The DUT is coupled to the device interface board. In one embodiment, configuring the independent test primitive includes loading a configuration firmware bit file to electronic test components that remain in the independent test primitive from one configuration to another. In one embodiment, the configuring is performed as part of operations to accommodate changes from a first device under test protocol or form factor to another second device under test protocol or form factor.

In block 730, testing of the device under test is directed based upon independent testing control from the primitive. In one embodiment, testing operations controlled by a first primitive are independent of testing operations controlled by a second primitive. Testing can be performed on one device under test independent of testing on another device under test. It is appreciated the present method is compatible with a variety of difference tests. In one exemplary implementation, the primitive can be remotely controlled.

In one embodiment, a plurality of primitives and device interface boards are installed in a rack. Multiple DUTs can be selectively tested at the same time. The primitives can control testing operations independent of one another. In one exemplary implementation, any of the primitives or device interface boards in such a rack can be replaced without causing the entire test system to stop.

Figure 8:
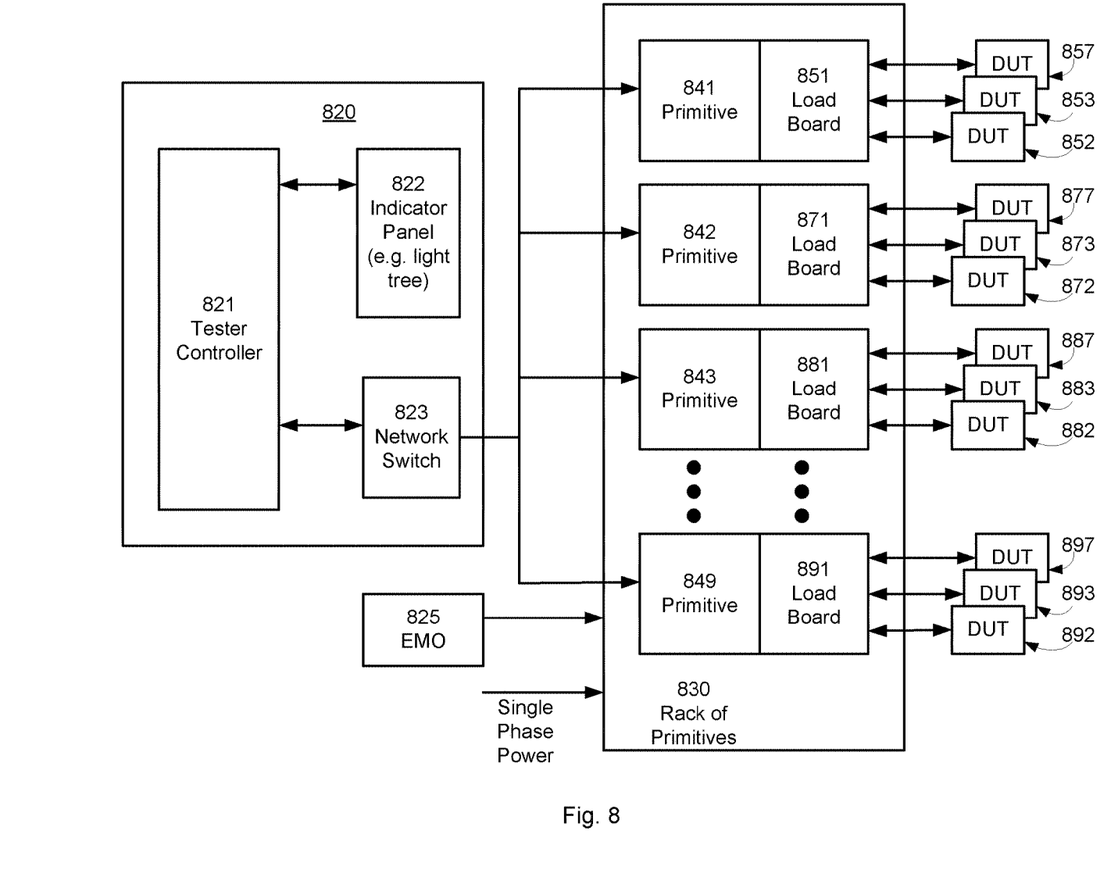
FIG. 8 is a block diagram of exemplary rack mounted primitives in accordance with one embodiment.

FIG. 8 is a block diagram of exemplary rack mounted primitives in accordance with one embodiment. The test system includes main controller 820 and rack 830. The rack 830 includes primitives 841, 842, 843, and 849 coupled to loadboards 851, 871, 881, and 991 respectively. Loadboards 851, 871, 881, and 991 can be included in respective device interface boards similar to the manner in which loadboard 417 is included in device interface board 410 in FIG. 5. With reference back to FIG. 8, load board 851 is coupled to DUTs 857, 853 and 852. Load board 871 is coupled to DUTs 877, 873 and 872. Load board 881 is coupled to DUTs 887, 883 and 882. Load board 891 is coupled to DUTs 897, 893 and 892. Primitives 841, 842, 843, and 849 are coupled to network switch 832 which is coupled to main tester controller 821. Main tester controller is coupled to indicator panel 822. In one embodiment, indicator panel 822 is a light emitting diode (LED) tree. Primitives 841, 842, 843, and 849 of rack 830 are also coupled to emergency off switch 825.

The primitives 841, 842, 843, and 849 can be linked together by a network switch 823 and main tester controller 821 into a collective or nested large system. In one embodiment, the network connection can determine how software configures a primitive to run the appropriate tests for the DUTs. In one exemplary implementation, primitives 841, 842, 843, and 849 are loosely coupled as compared to traditional systems. The core electronic test features in the respective primitives can be operated independently (e.g., testing operations are not limited by tight clock timing or synchronization requirements between primitives, etc.). The size of the rack mounted test system can be easily changed simply by increasing or reducing the primitives included in the system.

The term device under test is used to refer to a device that is a target of testing. It is appreciated that that one of ordinary skill in the art recognizes the term device under test can be used to describe devices undergoing testing, devices waiting to be tested or devices that have completed testing.

While embodiments are described in which the primitive and device interface board are not included in a large chamber, such as inside an oven or physical environmental enclosure, it is appreciated that embodiments are also compatible for use in a lager chamber or enclosure. In one embodiment, a primitive and device interface board capable of operating outside a large chamber can be readily moved or implemented inside the large chamber if desired.

Thus, presented embodiments facilitate convenient and efficient testing of electronic devices. In one embodiment, a primitive is the test system core of a self-contained independent unit and includes electronic components operable to control testing of a device under test. A primitive and device interface board can form a portable test system with minimal or no other infrastructure components as compared to traditional test systems. In one exemplary implementation, the connections of the primitive are modular and readily compatible with standard power and communication connections. A test system with an independent test primitive is portable and capable of operating unfettered by reliance or necessity of other control components. While a primitive is capable of operating independently in a portable distributed infrastructure manner, a primitive can also interact with a central controller or other primitives. The primitives can be linked together by a main networked controller into a collective or nested larger system that is loosely coupled as compared to traditional systems. The test system infrastructure base upon primitives is flexible and readily accommodates testing of different types of DUTs. A variety of changes can be made (e.g., changes to a DUT product mix, rearrangement of primitives within systems and between systems, etc.) while maintaining consistent core primitive components (with minimal or no hard wired changes or physical removal of electronic components), unlike conventional test systems that require significant expensive infrastructure and component alteration.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intend to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the following is a listing of exemplary concepts or embodiments associated with the novel approach. It is also appreciated that the listing is not exhaustive and does not necessarily include all possible implementation. The following concepts and embodiments can be implemented in hardware. In one embodiment, the following methods or process describe operations performed by various processing components or units. In one exemplary implementation, instructions, or directions associated with the methods, processes, operations etc. can be stored in a memory and cause a processor to implement the operations, functions, actions, etc.

It is appreciated that a memory storage management systems and methods can include the following exemplary concepts or embodiments. It is also appreciated that the listing is not exhaustive and does not necessarily include all possible implementations. The following concepts and embodiments can be implemented in hardware, firmware, software and so on. In one embodiment, the following concepts include methods or processes that describe operations performed by various processing components or units. In one exemplary implementation, instructions or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A test system comprising:
    a device interface board (DIB) configured to interface with a device under test (DUT); and
    a primitive configured to control the device interface board and testing of the device under test, wherein the primitive is an independent self-contained test control unit comprising:
        a backplane interface configured to couple with the device interface board;
        a power supply component configured to control power to the backplane interface; and
        a site module of the primitive that controls testing signals sent to the device interface board and device under test.

2. The testing method of claim 1, wherein the primitive is compatible with a distributed testing infrastructure.

3. The system of claim 1, wherein the primitive and device interface board are portable and operable to perform testing unfettered by other control components.

4. The test system of claim 1, wherein the site module of the primitive that controls testing signals is configured to communicate information to an exterior test component via a standard communication protocol and standard modular removable communication connector.

5. The test system of claim 1, wherein the power supply component is configured to receive power from a standard utility outlet via a modular removable power connector, convert the standard utility power into device under test power levels, and control delivery of power to the device under test.

6. The test system of claim 1, wherein the site module includes a field programmable gate array (FPGA) and the FPGA is reprogrammable for different test protocols by loading different configuration firmware bit files.

7. The test system of claim 1, wherein the site module of the primitive that controls testing signals is reconfigurable for different test protocols while maintaining core primitive components.

8. The test system of claim 1, wherein the backplane interface is configured to be compatible with a universal interface configuration.

9. The test system of claim 1, further comprising a remote control component configured to enable control of the primitive remotely.

10. The test method of claim 1, further comprising an environmental component controller configured to direct control of environmental components of the device interface board.

11. A testing method comprising:
    coupling an independent test primitive to a device interface board (DIB),
    configuring the independent test primitive to control testing of a device under test (DUT) that is coupled to the device interface board, wherein the configuring includes loading a configuration firmware bit file to electronic test components that remain in the independent test primitive from one configuration to another; and directing testing of the device under test based upon independent testing control by the primitive.

12. The testing method of claim 11, wherein the configuring is performed as part of operations to accommodate a change from a first type of device under test to another second type of device under test.

13. The testing method of claim 11, further comprising coupling the independent test primitive to main test controller wherein the independent test primitive maintains independent testing control of respective device interface boards and devices under test.

14. The testing method of claim 11, further comprising coupling the independent test primitive to another primitive wherein the independent test primitive maintains independent testing control of respective device interface boards and devices under test.

15. The testing method of claim 11, wherein the independent test primitive is portable and moved from a first location to a second location to perform testing operations independent of other primitives and other control components.

16. A test system comprising:
a plurality of device interface boards (DIBs) configured to interface with devices under test (DUTs);
a plurality of independent primitives respectively coupled to the plurality of device interface boards, wherein the plurality of primitives is configured to control the respective plurality of device interface boards and testing of the respective devices under test, wherein at least one of the plurality of independent primitives is an independent self-contained test control unit comprising:
a backplane interface configured to couple with the device interface board;
a power supply component configured to control power to the backplane interface; and
a site module of the primitive that controls testing signals sent to the device interface board and device under test; and
a rack for mounting the plurality of independent primitives and plurality of device interface boards (DIBs).

17. The test system of claim 16, further comprising a control console that is coupled to the plurality of primitives.

18. The test system of claim 16, wherein the operations of the plurality of independent primitives remain independent while being coordinated by a control panel.

19. The test system of claim 16, wherein the plurality of independent primitives is configured to accommodate multiple different device under test form factors and be compatible with a universal interface configuration of the primitive.

20. The test system of claim 16, wherein a universal interface configuration associated with the plurality of independent primitives is compatible with interfaces of different device interface boards.

* * * * *